United States Patent [19]

Kaya

[11] Patent Number: 5,019,532

[45] Date of Patent: May 28, 1991

[54] METHOD FOR FORMING A FUSE AND FUSE MADE THEREBY

[75] Inventor: Cetin Kaya, Dallas, Tex.

[73] Assignee: Texas Instruments Incorporated, Dallas, Tex.

[21] Appl. No.: 587,508

[22] Filed: Sep. 21, 1990

Related U.S. Application Data

[63] Continuation of Ser. No. 457,443, Dec. 27, 1989, abandoned.

[51] Int. Cl.$^5$ ............................................. H01L 29/44
[52] U.S. Cl. ..................................... 437/186; 437/240; 437/922; 437/985; 437/60; 437/919; 437/191; 148/DIG. 55; 357/51
[58] Field of Search ............... 437/186, 191, 240, 922, 437/985; 148/DIG. 55

[56] References Cited

U.S. PATENT DOCUMENTS

| 4,598,462 | 7/1986 | Chandrasekhar | 437/922 |
| 4,635,345 | 1/1987 | Hankins et al. | 437/922 |
| 4,823,181 | 4/1989 | Mohsen et al. | 357/51 |
| 4,876,220 | 10/1989 | Mohsen et al. | 437/170 |

OTHER PUBLICATIONS

Esmat Handy, John McCollum, Shih-ou Chen, Steve Chiang, Shafy Eltoukhy, Jim Chang; Ted Speers, Amr Mohsen, "Dielectric Based Antifuse for Logic and Memory ICs", IEEE, 1988, 786-789.

Primary Examiner—Brian E. Hearn
Assistant Examiner—Linda J. Fleck
Attorney, Agent, or Firm—W. James Brady, III; James T. Comfort; Melvin Sharp

[57] ABSTRACT

A method for forming a fuse for integrated circuits and a fuse produced therefrom is disclosed. The fuse (10) includes a substrate (12) having thick oxide layers (14) with a gap (16) formed therebetween. A second oxide layers (20), (14) is grown onto an N+ region (18). At the intersection between oxide layer (20), a sublithographic area is exposed and a dielectric layer (24) is formed therein. This structure is capable of reducing the capacitance between a polysilicon layer (26) formed thereon and the N+ diffusion region (18).

17 Claims, 2 Drawing Sheets

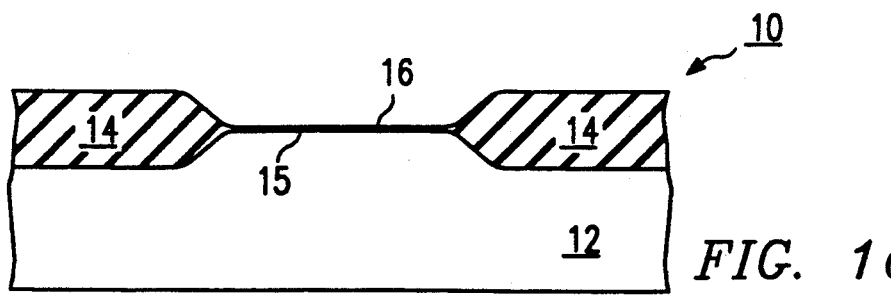
FIG. 1a
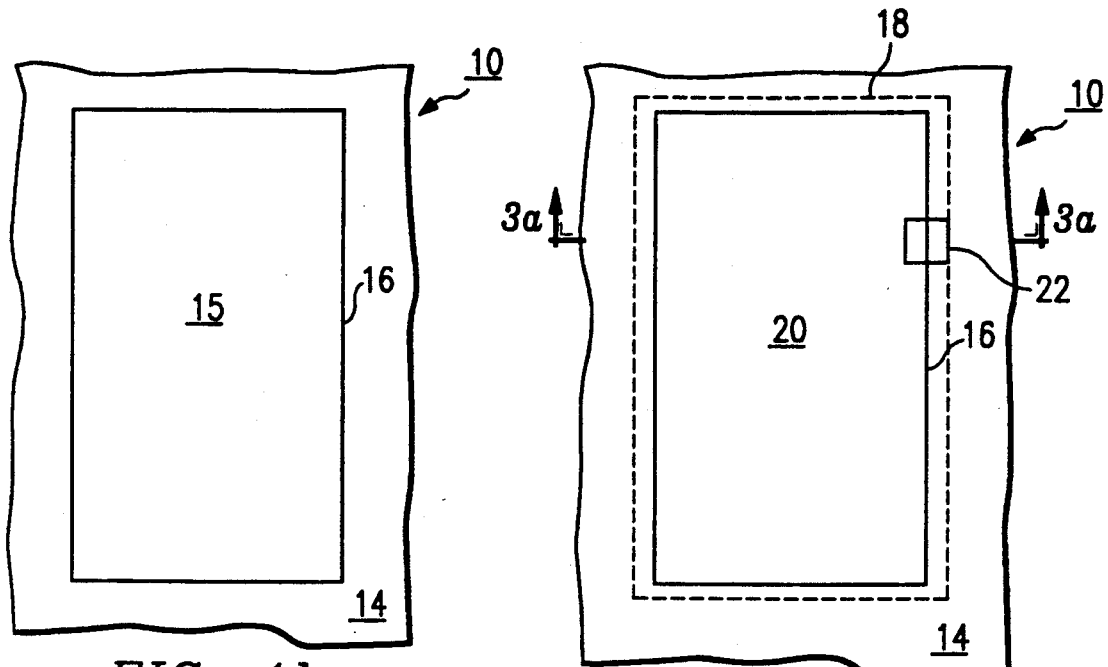
FIG. 1b
FIG. 3b
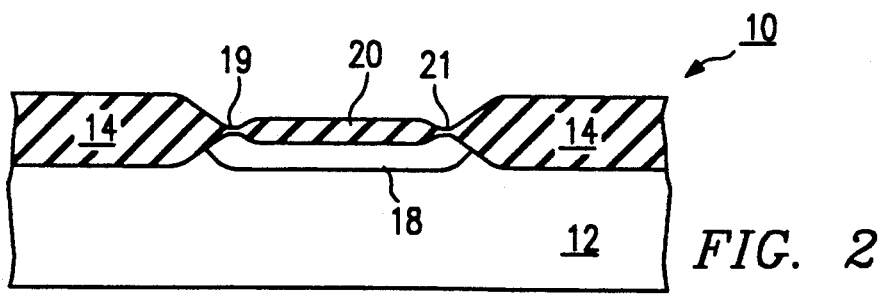
FIG. 2
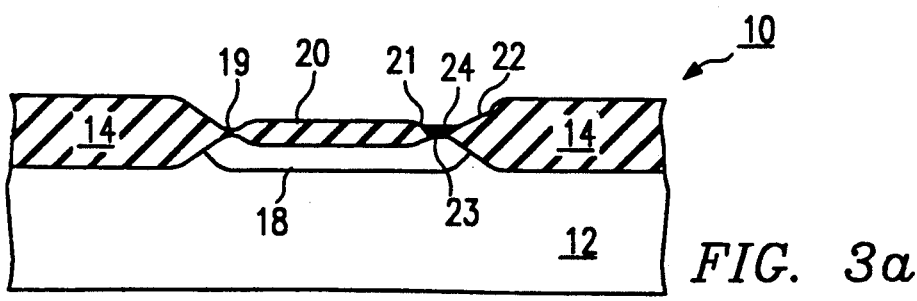
FIG. 3a

METHOD FOR FORMING A FUSE AND FUSE MADE THEREBY

This application is a continuation of U.S. application Ser. No. 07/457,443, filed Dec. 27, 1989 now abandoned.

TECHNICAL FIELD OF THE INVENTION

The present invention relates to a method for manufacturing integrated circuits and an apparatus made therefrom. More particularly, the invention relates to an improved method for forming a fuse for an integrated circuit.

BACKGROUND OF THE INVENTION

As the integrated circuit industry becomes more and more competitive, there is a need for more efficient integrated circuits which deliver electronic messages at faster rates than is presently accomplished. To design faster parts, the capacitance associated with interconnects, passive and active devices need to be reduced. For PROMs which use a thin dielectric as the fusing element, the capacitance of the cell will be greatly affected by the capacitance of the thin dielectric. Generally, capacitance per unit area of a thin film capacitor is equal to the ratio of the area divided by the thickness of the dielectric.

In the past, this limitation of capacitance has been dealt with by reducing the area of the fuse region and increasing the thickness of the dielectric. Unfortunately thicker dielectrics require higher voltages for fusing (dielectric breakdown). This in turn makes the incorporation of high voltage devices to standard logic process flow more difficult. Higher voltage requirements will as well increase the device isolation space making the cell bigger.

For a given lithographic capability, the area of the fuse cell would be limited by the minimum size of the geometry than can be defined by lithography.

Therefore, there is a need for a thin dielectric system for lower programming voltage while at the same time having very small area to reduce the capacitance associated with the fuse dielectric.

SUMMARY OF THE INVENTION

The present invention provides a method for forming a fuse on a semiconductor wafer and a fuse made therefrom. It allows the fabrication of a fuse cell where the area of the thin dielectric region is much smaller than that can be defined by lithography.

One aspect of the present invention is an apparatus having a layer of field oxide with a gap area formed therebetween to define a moat area. Within the moat area, an N+ region is fabricated by implanting an arsenic dopant therein. After the dopant has created the N+ region, a second oxide layer is formed in the moat region within the gap area. In its preferred embodiment, the second oxide layer is thinner the field oxide layer formed. A region is formed at the intersection between the first and second oxide layers to expose the N+ region. At this exposed N+ region, a dielectric is formed in accordance with the present invention. In its preferred embodiment, this dielectric is a composite of oxide and nitride. Specifically, a thin layer of oxide is initially grown onto the exposed N+ region. Subsequently, a layer of nitride is deposited onto the oxide layer. Finally, the top surface of the nitride is converted to oxide in an oxidizing ambient to make the dielectric of the present invention. After this dielectric has been formed, a layer of polysilicon is deposited over the entire dielectric stack.

A method for fabricating the fuse described above is preferably manufactured by initially growing a field oxide layer to a thickness of approximately 8000 angstroms on a silicon layer to form a moat region therein. This moat region is subsequently implanted with an arsenic having a concentration of approximately $2 \times 10^{\neq}$ atoms/cm$^2$ to create an N+ diffused region. The implantation of the arsenic dopant is followed by the growth of a second layer of oxide on the diffused region. A small portion of the N+ region is then exposed by selectively etching through the field and second oxide layers. The dielectric, as described above, is deposited onto the N+ region. Finally, a polysilicon layer is deposited onto the N+ region to complete the preferred embodiment of the present invention.

The present invention presents technical advantages over the prior method of fabricating a semiconductor fuse. This invention is capable of having a thin dielectric layer while at the same time having a low capacitance. The present invention has the capability of having a low capacitance by decreasing the area of the dielectric while at the same time maintaining a thin dielectric.

BRIEF DESCRIPTION OF THE DRAWINGS

Other aspects of the invention and their advantages may be appreciated with reference to the following Detailed Description taken in conjunction with the appended Drawings in which:

FIG. 1a is an enlarged cross-sectional view of a workpiece with a layer of field oxide grown thereon, according to the present invention;

FIG. 1b is a top view of the workpiece as illustrated in FIG. 1a;

FIG. 2 is an enlarged cross-sectional view of the workpiece as shown in FIG. 1a, illustrating a second oxide layer grown within a moat region as defined by the field oxide layer;

FIG. 3a is an enlarged cross-sectional view of the workpiece after a dielectric has been formed thereon;

FIG. 3b is a top view of the workpiece as illustrated in FIG. 3a taken substantially along line 3a—3a of FIG. 3b;

DETAILED DESCRIPTION OF THE INVENTION

Figure 4A:
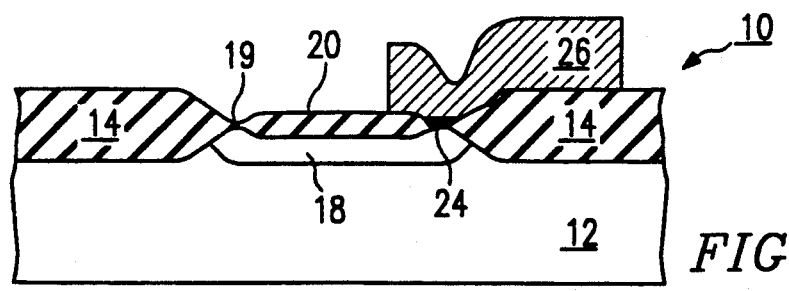
FIG. 4a is an enlarged cross-sectional view of the workpiece after a polysilicon layer has been deposited to interconnect the N+ region with a contacting element.

FIG. 1a is an enlarged cross-sectional view of a workpiece according to the present invention, generally designated 10. Workpiece 10 comprises a substrate 12, preferably a silicon wafer, having a boron dopant contained therein to create a P— region. Substrate 12 is generally a semiconductor layer in its broadest sense. A mask is selectively formed on a face of the semiconductor layer to define the area of field oxide layer 14 growth. Grown on substrate 12 is a field oxide layer 14 which functions as an insulator layer. Field oxide layer 14 is selectively grown to define a moat area 16 or diffused region. When forming field oxide layer 14 on substrate 12, it is preferable to heat the wafer to approximately 900 degrees Centigrade (°C.) for approximately 50 minutes with steam at approximately ten atmospheres. This heating of substrate 12 causes field oxide layer 14 to grow to approximately 8,000 angstroms thick. The actual thickness of field oxide layer 14 is dependent upon time, pressure, and temperature of the steam oxidation process. After substrate 12 has been adequately doped, a thin oxide layer 15 is thermally grown to approximately 350 angstroms thick in the moat region 16.

Referring now to FIG. 1b, a top view of workpiece 10, as illustrated in FIG. 1a, can be seen. Generally, moat area 16 is defined in a rectangular configuration. Moat area 16 can be formed in any one of several alternative configurations.

Referring now to FIG. 2, an enlarged cross-sectional view of a workpiece 10 illustrates subsequent processing steps. Initially, an N+ region 18 is formed in moat area 16 by controllably implanting an N-type dopant. This dopant is preferably arsenic, and is implanted into substrate 12 at an energy of 50 KeV and a dosage of about $1 \times 10^{16}$ atoms/cm$^2$.

After N+ region 18 has been formed, a second oxide layer 20 is formed in moat region 16. As can be seen, "buried" N+ oxide layer 20 is formed having ends 19 and 21. Layer 20 is formed by heating substrate 12 to approximately 900° C. and in the presence of oxygen for ten minutes. Substrate 12 is next heated to 900° C. for 38 minutes with steam. This process is followed by heating substrate 12 for approximately one minute at 900° C. in the presence of oxygen. This series of heating steps selectively grows oxide layer 20. The above-discussed implantation was self-aligned to the sloping edges of the field oxide 14. The concentration of dopant in region 18 decreases as a function of the thickness of the oxide layer 14 over it. The oxide layer 20 grows at a faster rate than dimples or ends 19 and 21 because the dopant concentration underneath layer 20 is greater. The combination of the sloped sidewalls or "bird's beak" of oxide layer 14 and the differential growth of oxide layer 20 creates a relative depression in the thickness of the oxide.

Now referring to FIG. 3a, photoresist layers are deposited and patterned onto workpiece 10 to define a region for subsequent etching of fuse area 22. The etch is preferably performed using a 10% buffered hydrofluoric acid (HF). Once fuse area 22 has been etched, a gap region forms 23 at end 21 where the N+ region is exposed. This exposed region is subsequently used for the depositing of layers to form a dielectric thereon. The sloping sidewalls of layers 14 and 20 mean that the size of the exposed region 23 can be carefully controlled by timing the etchback. Hence, an extremely small, submicron exposed area may be fabricated without the scaling limitations imposed by microlithography. The reduction in area translates into a reduction of cell capacitance.

A dielectric 24 is formed at end 21 by depositing or growing oxides and nitrides thereon. An oxide layer is grown approximately 35 to 40 angstroms thick by submitting workpiece 10 to 700° C. for ten minutes in the presence of nitrogen. Subsequently, workpiece 10 is exposed for 18 minutes to oxygen, followed by the exposure of substrate 12 to nitrogen for ten minutes.

After the oxygen has been deposited to form the first composite layer of dielectric 24, a nitride is deposited to approximately 85 angstroms thick. This deposition is performed by submitting workpiece 10 to a temperature of approximately 900° C. for 110 minutes in the presence of argon and oxygen. This method of creating a deposit dielectric can be easily understood by referring to U.S. Pat. No. 4,823,181, issued to Mohsen, et al., entitled "Programmable Low Impedance AntiFusion Element", and incorporated herein for reference.

Referring now to FIG. 3b, a top view of workpiece 10 as illustrated in FIG. 3a can be seen. Fuse area 22 is formed onto moat area 16. As can be appreciated, fuse area 22 can be anywhere along the boundary of moat area 16, depending upon the particular application.

Referring now to FIG. 4a, an enlarged crosssectional view of workpiece 10 can be seen. In accordance with the present invention, a polysilicon layer 26 is deposited to make contact with dielectric layer 24.

To complete the fabrication of the present invention, it is preferable that polysilicon layer 26 be deposited to approximately 4,500 angstroms thick. The workpiece 10 is submitted to a phosphorous dopant ambient in POCl$_3$ at 900° C. for 30 minutes to increase the conductivity of polysilicon layer 26. Once the layer has been formed, an arsenic dopant is implanted into polysilicon layer 26 at approximately 70 KeV and a dosage of $2 \times 10^{16}$ atoms/cm$^2$. After polysilicon layer 26 has been initially deposited, the configuration can be defined by depositing a photoresist layer patterning it and etching away the areas not covered by photoresist.

Figure 4B:
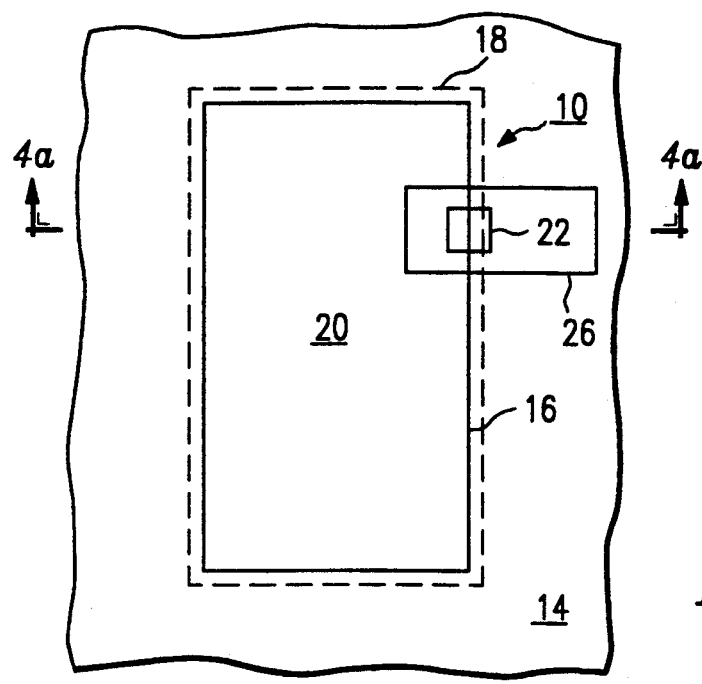
FIG. 4b is a top view of the workpiece as illustrated in FIG. 4a taken substantially along line 4a—4a of FIG. 4b.

FIG. 4b is a top view of workpiece 10, as illustrated in FIG. 4a.

Figure 5:
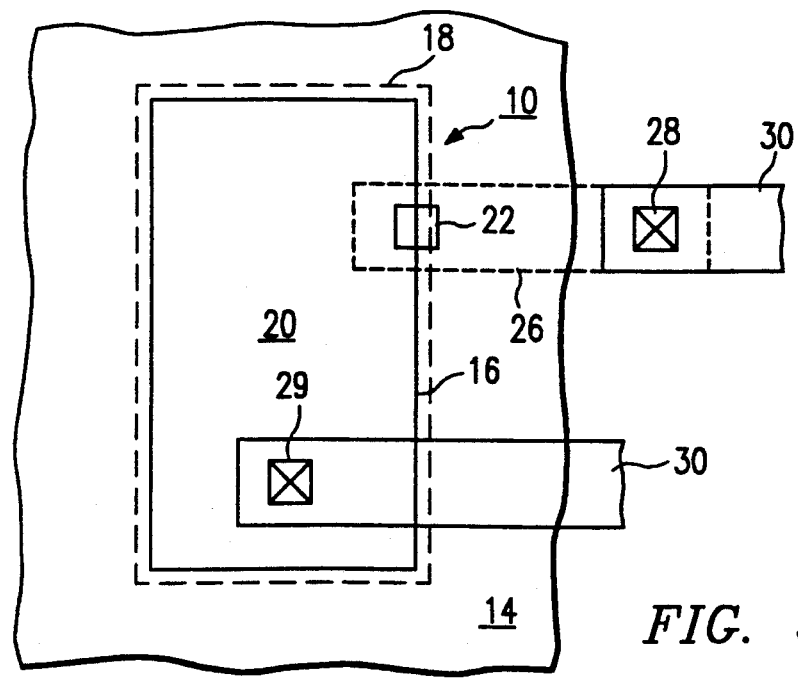
FIG. 5 is a top view of the workpiece 10 having contacts connected thereto, according to the present invention.

Referring now to FIG. 5, contacts are formed to polysilicon layer 26 and the surface of workpiece 10. A contact 29 is made through the oxide layer 20 to diffused region 18 to make electrical connection to the other electrode of the capacitor. Metal strips 30 may next be applied to contacts 28 and 29 to complete the illustrated embodiment of the present invention.

The present invention presents technical advantages over the prior art because it reduces capacitance of the formed capacitor. Unfortunately, prior art has not overcome the problems associated with a high capacitance due to a high ratio of the area divided by its thickness. According to the present invention, this specific embodiment is able to overcome problems associated with the prior art because of the small size of the semiconductor electrode.

While the preferred embodiment of the present invention and its advantages have been disclosed in the above-detailed description, the present invention is not limited thereto, but only by the spirit and scope of the appended claims.

What is claimed is:

1. A method for forming a fuse at a face of a semiconductor layer, comprising the steps of:

growing a first insulator layer laterally adjacent to at least one edge of a predefined diffusion region of the semiconductor layer, such that the first insulator layer has a sloping lateral boundary adjacent the diffusion region;

implanting a dopant in the diffusion region using the sloping lateral boundary as a mask, such that the concentration of the implanted dopant decreases as a function of the thickness of the first insulator layer thereover;

growing a second insulator layer on the diffusion region, said second insulator layer having a thickness varying with the implanted dopant concentration of the diffusion region thereunder;

selectively etching adjacent portions of the first and second insulator layers to expose a region on the face;

forming a dielectric fuse layer on the exposed region; and forming a conductor to adjoin the dielectric fuse layer.

2. The method as recited in claim 1, wherein said step of growing said first insulator layer comprises the step of growing a field oxide layer by steam oxidation.

3. The method as recited in claim 1, further comprising the step of doping said semiconductor layer to be of a first conductivity type;

wherein said step of implanting a dopant comprises the step of implanting the diffusion region to be of a second conductivity type opposite the first conductivity type.

4. The method as recited in claim 1, wherein said step of implanting a dopant comprises the step of implanting an arsenic dopant into said semiconductor layer in said diffusion region.

5. The method as recited in claim 1, wherein said step of forming a dielectric fuse layer on the exposed region comprises the steps of:

growing a first oxide layer over said exposed region;

depositing a nitride layer over said oxide layer in said exposed region; and growing a second oxide layer over said nitride layer.

6. The method as recited in claim 1, wherein the step of forming said conductor comprises the step of forming a highly doped polysilicon layer.

7. A method for forming a fuse, which comprises the steps of:

selectively forming a mask layer on a face of a semiconductor layer to define a diffusion region;

growing a field oxide layer on nonmasked areas of said face to create sloping lateral boundaries of the field oxide adjacent to the diffusion region;

removing said mask layer;

implanting a dopant into said face at said diffusion region using the field oxide layer as a mask;

growing a second layer of oxide over said diffusion region, such that the second oxide layer has a thickness varying as a function of the concentration of dopant thereunder;

patterning a fuse area within said diffusion region including the boundary between said oxide layers;

etching said field and second oxide layers to expose the semiconductor layer within said fuse area;

growing an oxide over said fuse area;

depositing a nitride over said oxide layer in said fuse area;

forming a polysilicon layer on said fuse area; and implanting arsenic in said polysilicon layer.

8. The method as recited in claim 7, further comprising the step of doping said semiconductor layer with a boron dopant to form a P− region.

9. The method as recited in claim 7, wherein said step of growing a layer of field oxide on said semiconductor layer is conducted by steam oxidation to form a layer of approximately 8,000 angstroms thick.

10. The method as recited in claim 7, wherein said step of growing an oxide over said fuse area comprises the steps of heating the semiconductor layer to approximately 700° C. for approximately 38 minutes while alternating a mixture of nitrogen and oxygen.

11. The method as recited in claim 7, wherein said step of depositing said polysilicon layer comprises a step of depositing the layer to a thickness of approximately 4,500 angstroms.

12. A method for fabricating a conductor to semiconductor fuse at a face of a semiconductor layer, comprising the steps of:

selectively forming a mask on the face to define a diffused region;

subjecting the face to a source of oxygen at an elevated temperature to create a field oxide layer having a sloping boundary adjacent to the diffused region;

removing the mask from the face;

implanting the diffused region with an impurity to increase the conductance of the region;

growing an oxide layer on said diffused region to have a thickness related to the impurity concentration in the diffused region thereunder;

etching said oxide layer and said field oxide layer to form a fuse region in which the diffused region is exposed;

alternately forming an oxide, a nitride, and an oxide layer on said exposed region to form a fuse element; and depositing a polysilicon layer on the fuse element to form the fuse.

13. A method for forming a fuse, comprising the steps of:

forming a first insulator layer on a semiconductor layer, said first insulator layer having first sloped sidewalls surrounding a moat area;

forming a second insulator layer over said moat area, said second insulator layer having second sloped sidewalls which contact said first sloped sidewalls;

removing portions of said first and second sloped sidewalls to expose a region on said semiconductor layer;

forming a dielectric fuse layer on said exposed region; and forming a conductor in contact with said dielectric fuse layer.

14. The method of claim 13 in which said step of forming a first insulator layer comprises the steps of:

forming a mask layer on the semiconductor layer to define said moat area; and growing a field oxide layer on nonmasked areas of the semiconductor layer.

15. The method of claim 13 in which said step of forming said second insulator layer comprises the steps of:

forming a diffusion region in said moat area, said diffusion region having a dopant concentration which varies as a function of the thickness of said first insulator layer over said diffusion region; and growing an oxide layer over said moat area, said oxide layer having a thickness which varies as a function of the dopant concentration under the oxide layer.

16. The method of claim 15 further comprising the step of doping said semiconductor layer to be of a first conductivity type;

said step of forming a diffusion region comprising the step of doping said diffusion region to be of a second conductivity type opposite the first conductivity type.

17. The method of claim 13 in which said step of removing portions of said first and second sidewalls comprises the steps of:

patterning a fuse area over said first and second sidewalls; and etching said first and second sidewalls to expose at least a portion of the semiconductor layer below the fuse area.

* * * * *